United States Patent
Zhang et al.

(10) Patent No.: US 10,374,083 B1
(45) Date of Patent: Aug. 6, 2019

(54) VERTICAL FIN FIELD EFFECT TRANSISTOR WITH REDUCED GATE LENGTH VARIATIONS

(71) Applicant: INTERNATIONAL BUSINESS MACHINES CORPORATION, Armonk, NY (US)

(72) Inventors: Chen Zhang, Albany, NY (US); Kangguo Cheng, Schenectady, NY (US); Xin Miao, Guilderland, NY (US); Wenyu Xu, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/873,564

(22) Filed: Jan. 17, 2018

(51) Int. Cl.
| | |
|---|---|
| *H01L 27/088* | (2006.01) |
| *H01L 29/78* | (2006.01) |
| *H01L 21/8234* | (2006.01) |
| *H01L 21/762* | (2006.01) |
| *H01L 21/311* | (2006.01) |
| *H01L 29/10* | (2006.01) |
| *H01L 21/3065* | (2006.01) |
| *H01L 29/66* | (2006.01) |
| *H01L 29/06* | (2006.01) |

(Continued)

(52) U.S. Cl.
CPC ...... *H01L 29/7827* (2013.01); *H01L 21/3065* (2013.01); *H01L 21/31144* (2013.01); *H01L 21/762* (2013.01); *H01L 21/823487* (2013.01); *H01L 27/088* (2013.01); *H01L 29/0649* (2013.01); *H01L 29/0847* (2013.01); *H01L 29/1037* (2013.01); *H01L 29/1079* (2013.01); *H01L 29/42376* (2013.01); *H01L 29/6656* (2013.01)

(58) Field of Classification Search
CPC . H01L 21/762; H01L 21/3065; H01L 21/845; H01L 21/823431; H01L 21/8232; H01L 21/823821; H01L 21/823487
USPC .......................... 257/329; 438/135, 142, 206
See application file for complete search history.

(56) References Cited

U.S. PATENT DOCUMENTS

| | | |
|---|---|---|
| 6,770,534 B2 | 8/2004 | Cho et al. |
| 7,078,298 B2 | 7/2006 | Lee et al. |

(Continued)

OTHER PUBLICATIONS

Bi et al., "Forming Strained and Unstrained Features on a Substrate," U.S. Appl. No. 15/278,420, filed Sep. 28, 2016. pp. 1-40.

*Primary Examiner* — Chuong A Luu
(74) *Attorney, Agent, or Firm* — Tutunjian & Bitetto, P.C.; Vazken Alexanian

(57) ABSTRACT

A method of forming a fin field effect transistor is provided. The method includes forming an elevated substrate tier on a substrate, and forming a fin mesa on the elevated substrate tier with a fin template layer on the fin mesa, wherein the elevated substrate tier is laterally larger than the fin mesa and fin template layer. The method includes forming a fill layer on the substrate, wherein the fill layer surrounds the fin mesa, elevated substrate tier, and fin template layer, forming a plurality of fin masks on the fill layer and fin template layer, and removing portions of the fill layer, fin template layer, and fin mesa to form a plurality of dummy fins from the fill layer, one or more vertical fins from the fin mesa, and a dummy fin portion on opposite ends of each of the one or more vertical fins from the fill layer.

15 Claims, 11 Drawing Sheets

(51) Int. Cl.
    *H01L 29/423*     (2006.01)
    *H01L 29/08*     (2006.01)

(56) References Cited

U.S. PATENT DOCUMENTS

| | | |
|---|---|---|
| 7,300,837 B2 | 11/2007 | Chen et al. |
| 7,683,428 B2 | 3/2010 | Chidambarrao et al. |
| 9,202,894 B1 | 12/2015 | Zang |
| 9,299,835 B1 | 3/2016 | Anderson et al. |
| 9,704,990 B1 | 7/2017 | Mochizuki et al. |
| 9,711,618 B1 | 7/2017 | Cheng et al. |
| 9,755,073 B1 | 9/2017 | Cheng et al. |
| 9,799,765 B1 | 10/2017 | Bergendahl et al. |
| 2006/0261406 A1 | 11/2006 | Chen |
| 2015/0214377 A1* | 7/2015 | Ito ............. H01L 29/7869 257/43 |
| 2017/0012042 A1* | 1/2017 | Cai ............. H01L 29/6656 |
| 2017/0229468 A1* | 8/2017 | Yang ........... H01L 27/1104 |

\* cited by examiner

VERTICAL FIN FIELD EFFECT TRANSISTOR WITH REDUCED GATE LENGTH VARIATIONS

BACKGROUND

Technical Field

The present invention generally relates to forming vertical fin field effect transistors (FinFETs) with reduced variations in gate lengths, and more particularly to compensating for loading effects on the ends of vertical fins that cause tapering gate heights.

Description of the Related Art

A Field Effect Transistor (FET) typically has a source, a channel, and a drain, where current flows from the source to the drain, and a gate that controls the flow of current through the device channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin rectangular silicon (Si), commonly referred to as the fin with a gate on the fin, as compared to a MOSFET with a single gate parallel with the plane of the substrate. Depending on the doping of the source and drain, an n-FET or a p-FET can be formed.

Examples of FETs can include a metal-oxide-semiconductor field effect transistor (MOSFET) and an insulated-gate field-effect transistor (IGFET). Two FETs also can be coupled to form a complementary metal oxide semiconductor (CMOS) device, where a p-channel MOSFET and n-channel MOSFET are coupled together.

With ever decreasing device dimensions, forming the individual components and electrical contacts becomes more difficult. An approach is therefore needed that retains the positive aspects of traditional FET structures, while overcoming the scaling issues created by forming smaller device components.

SUMMARY

In accordance with an embodiment of the present invention, a method of forming a fin field effect transistor is provided. The method includes forming an elevated substrate tier on a substrate, and forming a fin mesa on the elevated substrate tier with a fin template layer on the fin mesa, wherein the elevated substrate tier is laterally larger than the fin mesa and fin template layer. The method includes forming a fill layer on the substrate, wherein the fill layer surrounds the fin mesa, elevated substrate tier, and fin template layer, forming a plurality of fin masks on the fill layer and fin template layer, and removing portions of the fill layer, fin template layer, and fin mesa to form a plurality of dummy fins from the fill layer, one or more vertical fins from the fin mesa, and a dummy fin portion on opposite ends of each of the one or more vertical fins from the fill layer.

In accordance with another embodiment of the present invention, a method of forming a fin field effect transistor is provided. The method includes forming an elevated substrate tier on a substrate, wherein the elevated substrate tier has a height from the top surface of the substrate in a range of about 10 nm to about 50 nm. The method further includes forming a fin mesa on the elevated substrate tier with a fin template layer on the fin mesa, wherein the elevated substrate tier is laterally larger than the fin mesa and fin template layer. The method further includes forming a fill layer on the substrate, wherein the fill layer surrounds the fin mesa, elevated substrate tier, and fin template layer. The method further includes forming a plurality of fin masks on the fill layer and fin template layer, and removing portions of the fill layer, fin template layer, and fin mesa to form a plurality of dummy fins from the fill layer, one or more vertical fins from the fin mesa, and a dummy fin portion on each of the opposite ends of each of the one or more vertical fins from the fill layer, wherein each of the dummy fin portions extends a distance of about 20 nm to about 100 nm from an endwall of the one or more vertical fins.

In accordance with yet another embodiment of the present invention, a fin field effect transistor is provided. The fin field effect transistor includes an elevated substrate tier on a substrate, one or more vertical fins on the elevated substrate tier, a dummy fin portion on opposite ends of each of the one or more vertical fins from the fill layer, an isolation region surrounding the elevated substrate tier, and a plurality of dummy fins on the isolation region.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
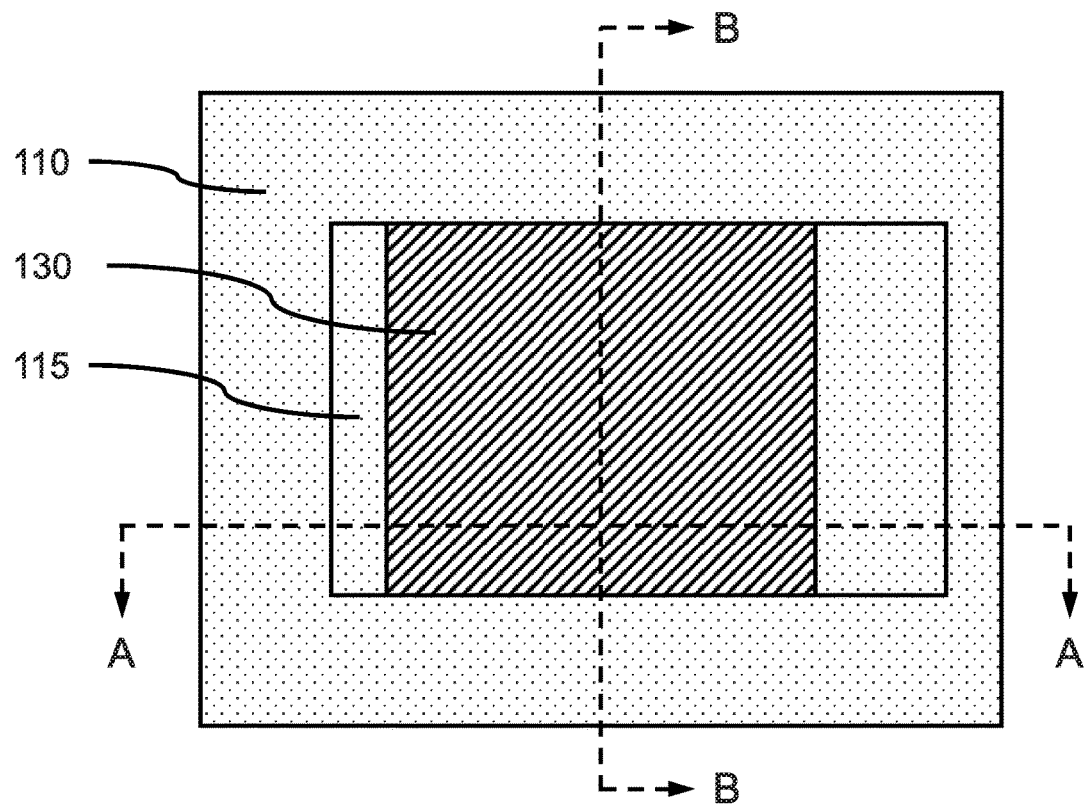
FIG. 1 is a top view showing a fin template layer on a fin mesa, and an elevated substrate tier below the fin mesa, in accordance with an embodiment of the present invention.

Embodiments of the present invention relate generally to controlling fabrication steps and fin configurations and dimensions to compensate for etching loading effects on the ends of vertical fins that cause tapering gate heights. Organic planarization layer (OPL) recessing and lateral work function metal etching can produce gate structures with different heights at different positions along the fin length. The inconsistency in recessing the OPL can result in shorter gate lengths near the two ends of a vertical fin and on the outer sidewall of edge fins facing away from other neighboring vertical fins.

Embodiments of the present invention relate generally to forming dummy vertical fins at the perimeter of a substrate region where loading effects and tapering can be the largest, and dummy fin portions extending from the endwalls of the active fins, where the tapering of the layers forming the gate structure can be the greatest. Extending the fin length of the vertical fins using dummy portions can shift the largest tapering effect outward from the active semiconductor portion of the fin to the dummy portion, thereby decreasing the gate length variation on the device channel.

Embodiments of the present invention relate generally to forming a fin mesa and the elevated substrate tier surrounded by a fill layer from which dummy fins and dummy fin portions can be formed along with the active vertical fins during a fin formation process. The dummy fins can be formed on the periphery of a substrate region with active vertical fins formed within the interior of the region. The dummy fins can be formed on opposite sides of the interior region, where the outer sidewalls face away from other neighboring vertical fins, and the interior vertical fins experience more uniform loading effects when recessing the OPL and etching the gate structure layers.

Exemplary applications/uses to which the present invention can be applied include, but are not limited to: logic and memory devices using vertical fin field effect transistors.

It is to be understood that aspects of the present invention will be described in terms of a given illustrative architecture; however, other architectures, structures, substrate materials and process features and steps can be varied within the scope of aspects of the present invention.

Referring now to the drawings in which like numerals represent the same or similar elements and initially to FIG. 1, a top view of a fin template layer on a fin mesa, and an elevated substrate tier below the fin mesa is shown, in accordance with an embodiment of the present invention.

A substrate 110 can be, for example, a single crystal semiconductor material wafer or a semiconductor-on-insulator stacked wafer. The substrate can include a support layer that provides structural support, and an active semiconductor layer that can form devices. An insulating layer may be between the active semiconductor layer and the support layer to form a semiconductor-on-insulator substrate (SeOI) (e.g., a silicon-on-insulator substrate (SOI)).

The support layer can include crystalline, semi-crystalline, micro-crystalline, nano-crystalline, and/or amorphous phases. The support layer can be a semiconductor (e.g., silicon (Si), silicon carbide (SiC), silicon-germanium (SiGe), germanium (Ge), gallium-arsenide (GaAs), cadmium-telluride (CdTe), etc.), an insulator (e.g.: glass (e.g. silica, borosilicate glass), ceramic (e.g., aluminum oxide ($Al_2O_3$, sapphire), plastic (e.g., polycarbonate, polyacetonitrile), metal (e.g. aluminum, gold, titanium, molybdenum-copper (MoCu) composites, etc.), or combination thereof.

The active semiconductor layer can be a crystalline semiconductor, for example, a IV or IV-IV semiconductor (e.g., silicon (Si), silicon carbide (SiC), silicon-germanium (SiGe), germanium (Ge)), a III-V semiconductor (e.g., gallium-arsenide (GaAs), indium-phosphide (InP), indium-antimonide (InSb)), a II-VI semiconductor (e.g., cadmium-telluride (CdTe), zinc-telluride (ZnTe), zinc sulfide (ZnS), zinc selenide (ZnSe)), or a IV-VI semiconductor (e.g., tin sulfide (SnS), lead selenide (PbSb)).

The insulating layer can be, for example, a buried oxide (BOX) layer (e.g., SiO$_2$) or an implanted layer forming a buried insulating material.

In one or more embodiments, a fin template layer 130 can be formed on the substrate 110, where the fin template layer 130 is formed during the patterning process. The fin template layer 130 can be a hardmask, for example, silicon oxide (SiO), silicon nitride (SiN), a silicon oxynitride (SiON), a silicon carbonitride (SiCN), a silicon boronitride (SiBN), a silicon borocarbide (SiBC), a silicon boro carbonitride (SiBCN), a boron carbide (BC), a boron nitride (BN), or combinations thereof. A thin (i.e., <1 nm) oxide layer can be between the top surface of the substrate 110 or fin mesa and the fin template 130.

In various embodiments, the fin template layer 130 can have a length in a range of about 20 nanometers (nm) to about 200 nm, or in the range of about 50 nm to about 100 nm, where the length of the fin template layer 130 can determine the length of subsequently formed vertical fins formed from an underlying fin mesa.

In various embodiments, the fin template layer 130 can have a width in a range of about 30 nm to about 5000 nm (5 μm), or in the range of about 300 nm to about 2500 nm, or in the range of about 500 nm to about 1000 nm, or in the range of about 30 nm to about 200 nm, where the width of the fin template layer 130 can determine the number of vertical fins formed from an underlying fin mesa. A minimum width of about 30 nm can be used to form a single vertical fin.

The fin template layer 130 can be patterned to have a square or rectangular shape that covers a portion of the substrate 110. An exposed portion of the substrate not covered by the patterned fin template layer 130 can be removed to reduce the height of the surrounding substrate to a predetermined depth to form a fin mesa 120. Portions of the substrate on opposite sides of the long axis of the fin template layer 130 can be subsequently masked, and additional portions of the substrate removed to reduce the height of the substrate to a second predetermined depth to form an elevated substrate tier 115 below the fin mesa 120. The elevated substrate tier 115 can extend outward from two opposite sides of the fin template layer 130 and fin mesa 120, while being flush with the sidewalls of the fin mesa 120 on the other two opposite sides.

In various embodiments, the elevated substrate tier 115 can be laterally larger than the fin mesa 120 by about 20 nm to about 60 nm, where the amounts that the elevated substrate tier 115 extends outward from each side of the fin mesa 120 can be non-symmetric. In various embodiments, the elevated substrate tier 115 can extend outward from only one side of the fin mesa 120.

Figure 2:
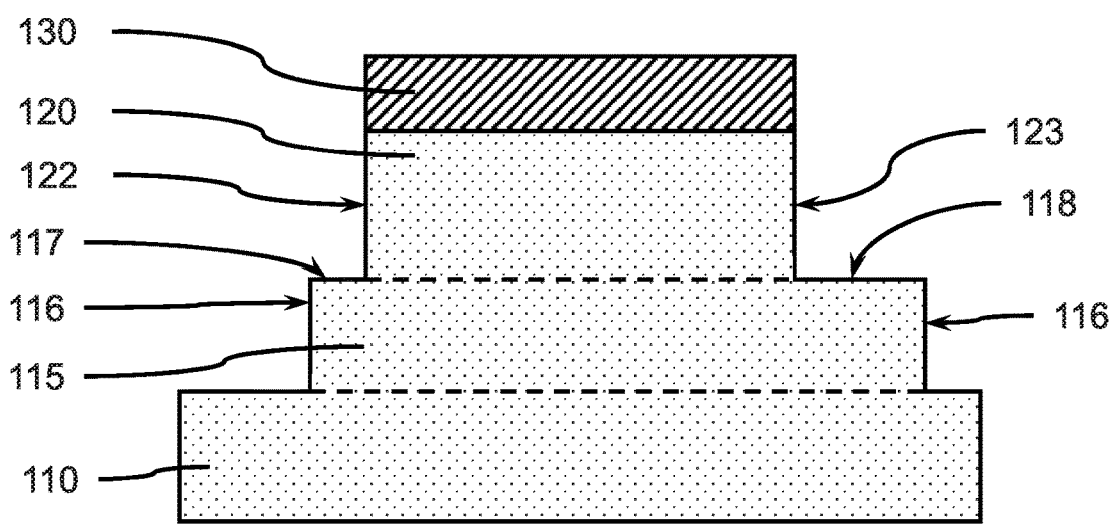
FIG. 2 is a cross-sectional side view of the AA cross-section of FIG. 1 showing a fin template layer on a fin mesa, and the elevated substrate tier below the fin mesa, in accordance with an embodiment of the present invention.

FIG. 2 is a cross-sectional side view of the AA cross-section of FIG. 1 showing a fin template layer on a fin mesa, and the elevated substrate tier below the fin mesa, in accordance with an embodiment of the present invention.

In various embodiments, a fin mesa 120 can be formed from the substrate below the fin template layer 130, where the fin mesa 120 can be formed using a directional, anisotropic etch, for example, a reactive ion etch (RIE). The etching can be conducted to a predetermined depth to form the fin mesa with a height equal to a predetermined height from which one or more vertical fins can be formed.

In one or more embodiments, the fin mesa 120 and adjoining sections of the substrate 110 can be masked using a lithographic resist or hardmask that can be patterned. An additional portion of the substrate can then be removed from around the masked portions of the fin mesa and substrate to form an elevated substrate tier 115 below the fin mesa 120. The elevated substrate tier 115 can be formed by a directional etch (e.g., RIE). The elevated substrate tier 115 can form a step 116 and ledges 117, 118 on opposite sides of the fin mesa 120, where a step and ledge can be on opposite ends of the fin mesa 120 and subsequently formed vertical fins. The elevated substrate tier 115 and fin mesa 120 can be the same semiconductor material as the substrate 110.

In one or more embodiments, the fin mesa 120 can have a height from the top surface of the ledges 117, 118 in a range of about 20 nm to about 100 nm, or in the range of about 20 nm to about 70 nm, or in the range of about 20 nm to about 40 nm, although other heights are contemplated.

In one or more embodiments, the elevated substrate tier 115 can have a height from the top surface of the substrate 110 in a range of about 10 nm to about 50 nm, or in the range of about 10 nm to about 40 nm, or in the range of about 10 nm to about 20 nm, although other heights are contemplated. The height of the elevated substrate tier 115 can be greater than the depth of a bottom source/drain region formed below one or more vertical fins formed from the fin mesa 120.

In various embodiments, the ledge 117 can extend a distance from the endwall face 122 of the fin mesa 120 (i.e., width) in a range of about 5 nm to about 15 nm, or in a range of about 7 nm to about 10 nm, although other distances are contemplated.

In various embodiments, the ledge 118 can extend a distance from the endwall face 123 of the fin mesa 120 (i.e., width) in a range of about 10 nm to about 50 nm, or in a range of about 15 nm to about 30 nm, although other distances are contemplated. The ledge 118 can extend a distance to allow formation of a bottom source/drain contact to a bottom source/drain region in the elevated substrate tier 115.

In various embodiments, there may not be a ledge 117, where the endwall of the elevated substrate tier 115 is flush with the endwall face 122 of the fin mesa 120, so a step 116 is not formed on that side of the fin mesa 120.

Figure 3:
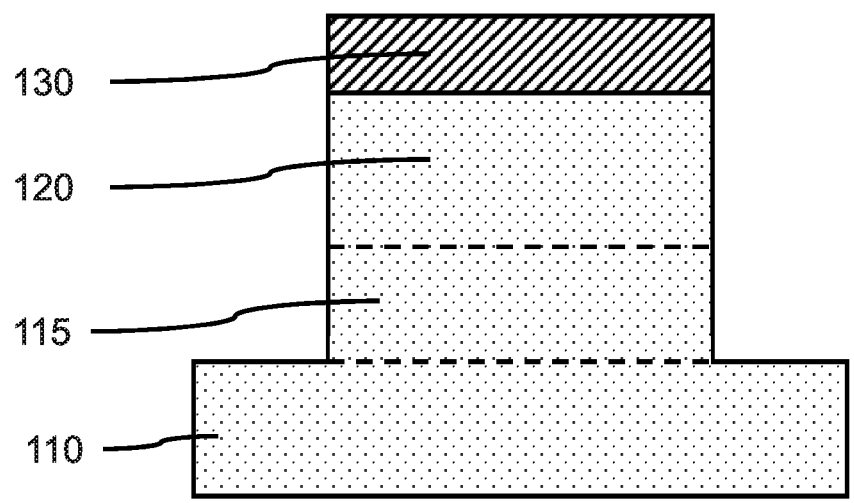
FIG. 3 is a cross-sectional side view of the BB cross-section of FIG. 1 showing the fin template layer on the fin mesa and elevated substrate tier, in accordance with an embodiment of the present invention.

FIG. 3 is a cross-sectional side view of the BB cross-section of FIG. 1 showing the fin template layer on the fin mesa and elevated substrate tier, in accordance with an embodiment of the present invention.

In one or more embodiments, the sidewalls of the elevated substrate tier 115 are flush with the sidewalls of the fin mesa 120. The elevated substrate tier 115 and fin mesa 120 can have a width in a range of about 30 nm to about 5000 nm (5 μm), or in the range of about 300 nm to about 2500 nm, or in the range of about 500 nm to about 1000 nm, or in the range of about 30 nm to about 200 nm, where the width of the fin mesa 120 can determine the number of vertical fins capable of being formed. The length of the formed vertical fins 111 can be the same as the length of the fin template layer 130.

Figure 4:
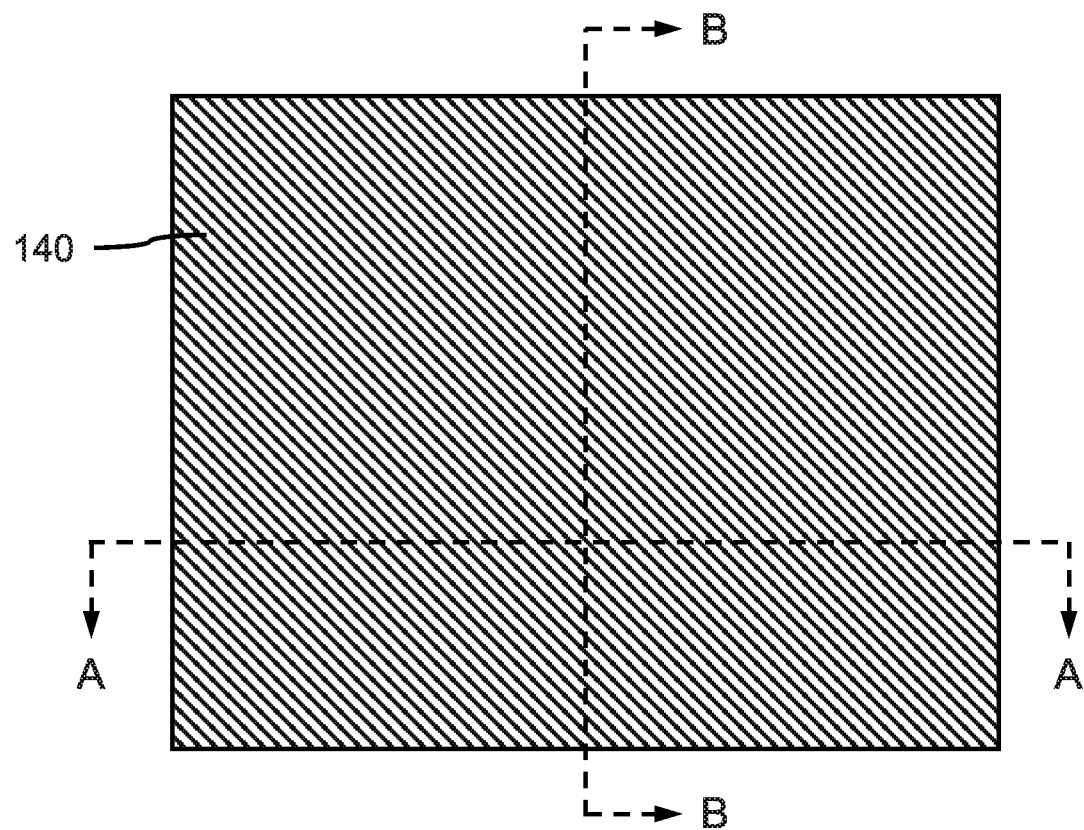
FIG. 4 is a top view showing a fill layer on the fin template layer, elevated substrate tier, and substrate, in accordance with an embodiment of the present invention.

FIG. 4 is a top view showing a fill layer on the fin template layer, elevated substrate tier, and substrate, in accordance with an embodiment of the present invention.

In one or more embodiments, a fill layer 140 can be formed on the fin template layer 130, elevated substrate tier 115, and substrate 110, where the fill layer 140 can be formed by a blanket deposition (e.g., CVD, PVD, Spin-on, etc.). The fill layer 140 can cover the substrate surface and ledges 117, 118, so the elevated substrate tier 115 and fin mesa 120 are surrounded by the material of the fill layer 140.

In various embodiments, the material of the fill layer 140 can be silicon oxide (SiO), silicon nitride (SiN), a silicon oxynitride (SiON), a silicon carbonitride (SiCN), a silicon boronitride (SiBN), a silicon borocarbide (SiBC), a silicon boro carbonitride (SiBCN), a boron carbide (BC), a boron nitride (BN), or combinations thereof. The fill layer 140 can be the same material as the fin template layer 130, so the fin template layer 130 and fill layer 140 can be selectively etched at the same time using the same process (e.g., RIE).

Figure 5:
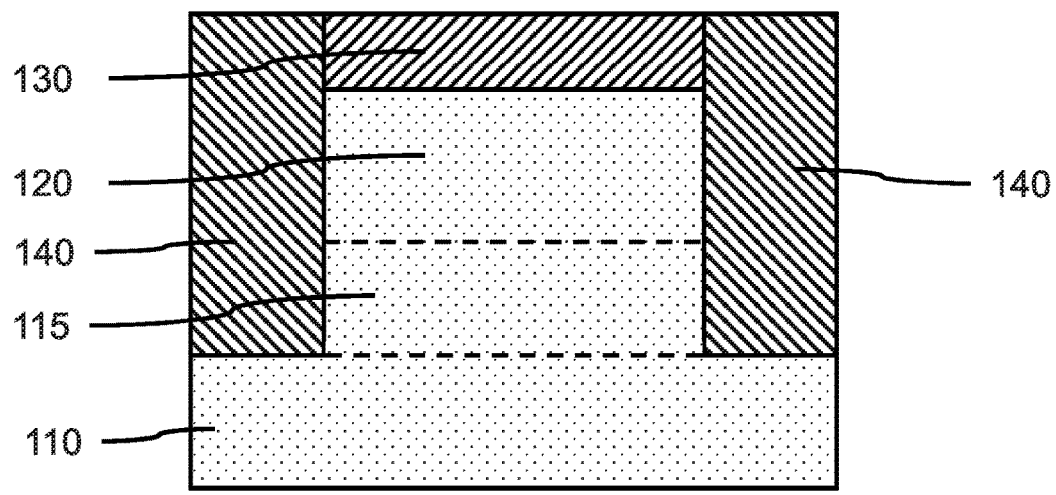
FIG. 5 is a cross-sectional side view of the BB cross-section of FIG. 4 showing the fill layer on the substrate, in accordance with an embodiment of the present invention.

FIG. 5 is a cross-sectional side view of the BB cross-section of FIG. 4 showing the fill layer on the substrate, in accordance with an embodiment of the present invention.

In various embodiments, a chemical-mechanical polishing (CMP) can be used to remove portions of the fill layer 140 that extends above the fin template layer 130 to provide a smooth, flat surface, and expose the top surface of the fin template layer 130. The fill layer 140 can cover the sidewalls and endwalls of the elevated substrate tier 115 and fin mesa 120.

Figure 6:
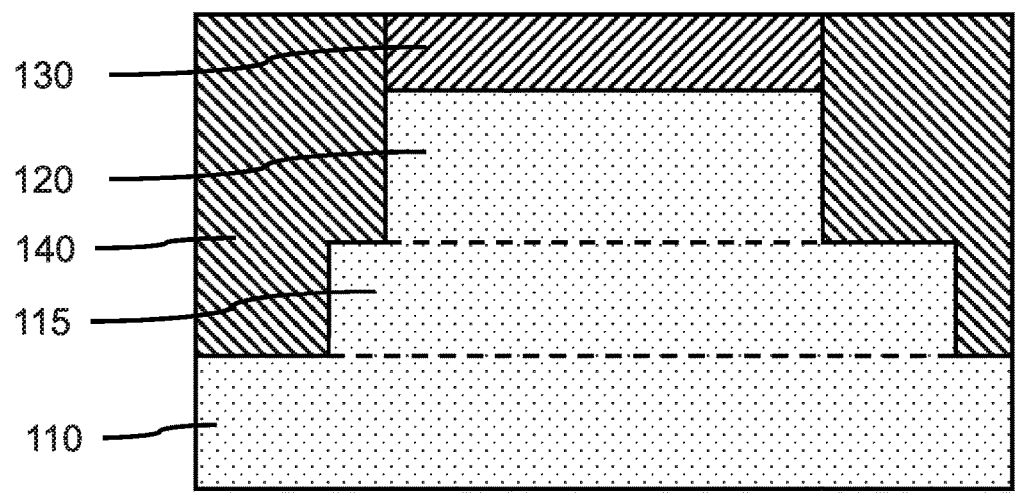
FIG. 6 is a cross-sectional side view of the AA cross-section of FIG. 4 showing the fill layer on the elevated substrate tier and substrate, in accordance with an embodiment of the present invention.

FIG. 6 is a cross-sectional side view of the AA cross-section of FIG. 4 showing the fill layer on the elevated substrate tier and substrate, in accordance with an embodiment of the present invention.

The fill layer 140 can cover the ledges 117, 118 of the elevated substrate tier 115, and cover the portions of the substrate adjoining the elevated substrate tier 115.

Figure 7:
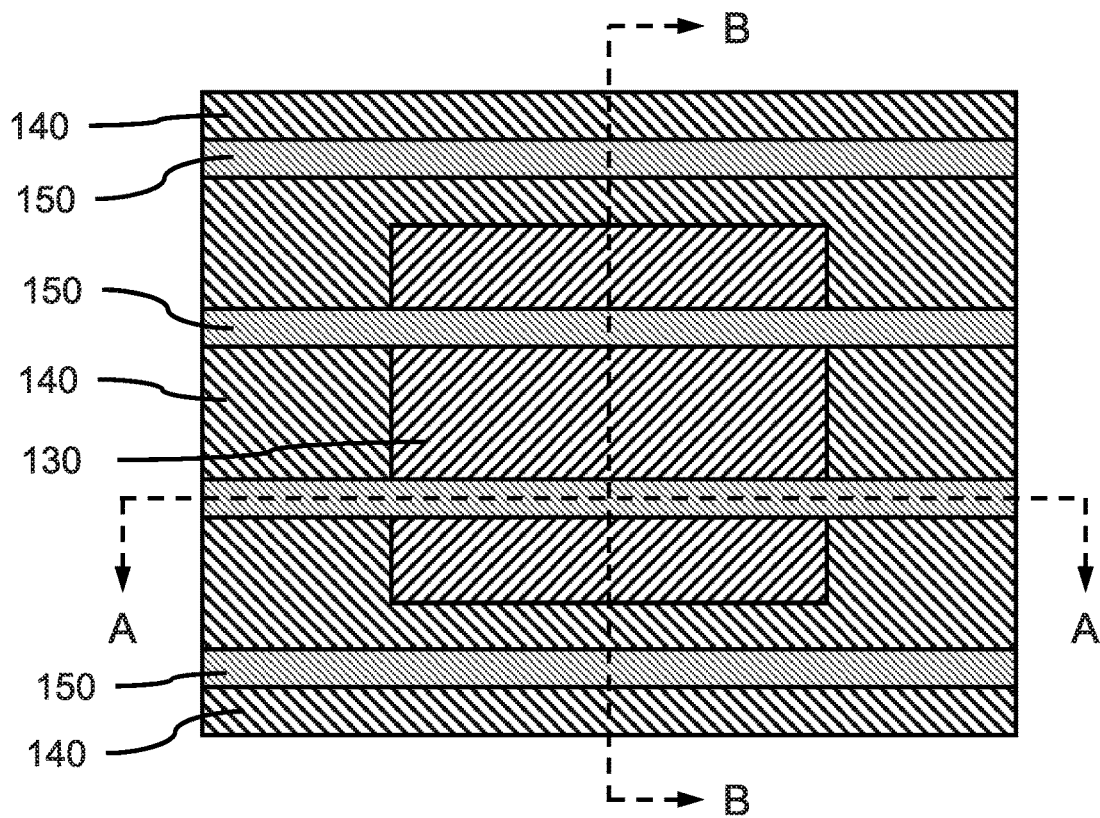
FIG. 7 is a top view showing a plurality of fin masks formed on the top surfaces of the fin template layer and fill layer, in accordance with an embodiment of the present invention.

FIG. 7 is a top view showing a plurality of fin masks formed on the top surfaces of the fin template layer and fill layer, in accordance with an embodiment of the present invention.

In one or more embodiments, a plurality of fin masks 150 can be formed on the top surface of the fin template layer 130 and fill layer 140, where the fin masks 150 can be formed and patterned by lithographic methods. Portions of the fin template layer 130 and fill layer 140 can be exposed by patterning and developing the fin masks 150. The fin masks can be aligned with the intended direction of a long axis of subsequently formed vertical fins.

In various embodiments, the fin masks 150 can be a soft mask material, for example, a lithography resist material, such as a polymeric material (e.g. poly(methyl methacrylate) (PMMA), siloxanes, polydimethylsiloxane (PDMS), hydrogen silsesquioxane (HSQ), tetraethyl orthosilicate (TEOS), etc.) or amorphous carbon (a-C).

Figure 8:
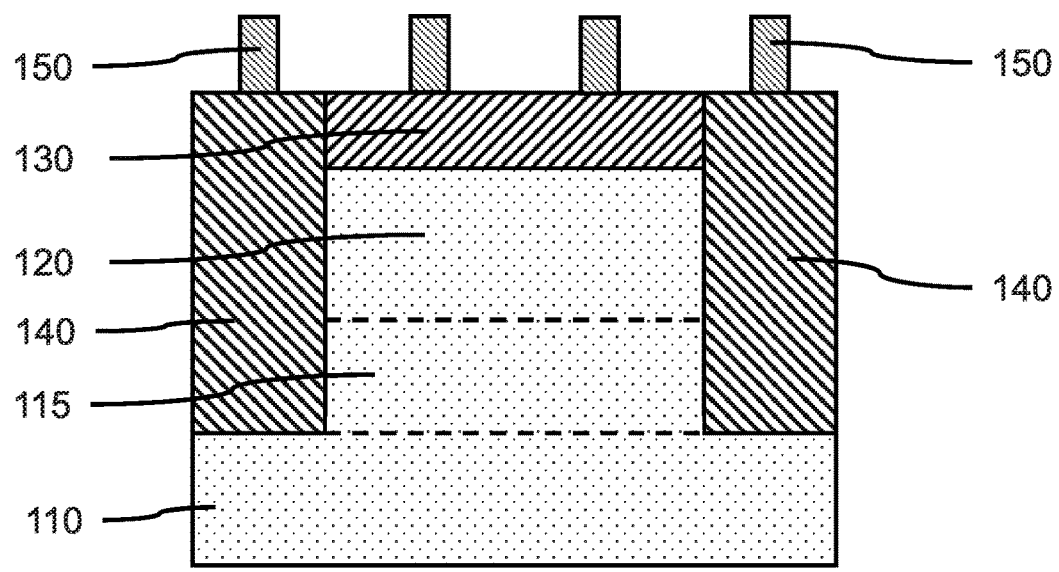
FIG. 8 is a cross-sectional side view of the BB cross-section of FIG. 7 showing the plurality of fin masks formed on the top surfaces of the fin template layer and fill layer, in accordance with an embodiment of the present invention.

FIG. 8 is a cross-sectional side view of the BB cross-section of FIG. 7 showing the plurality of fin masks formed on the top surfaces of the fin template layer and fill layer, in accordance with an embodiment of the present invention.

In various embodiments, the fin masks 150 can be formed over portions of the fill layer 140 that extends from the surface of the substrate to the top surface, and fin masks 150 can be formed over portions of the fin template layer 130 and fin mesa 120, where the pattern of the fin masks 150 can be transferred to these underlying layers.

Figure 9:
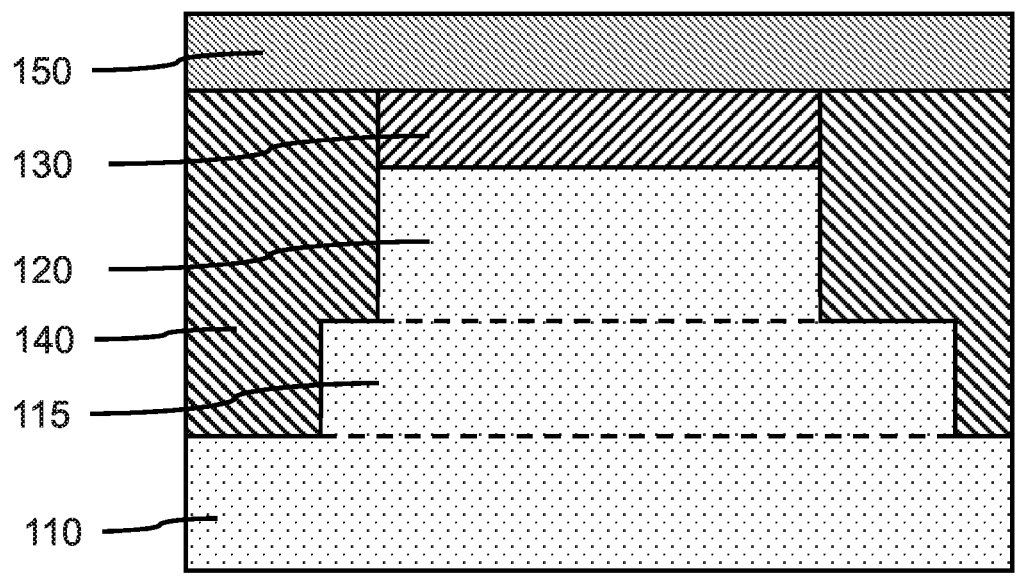
FIG. 9 is a cross-sectional side view of the AA cross-section of FIG. 7 showing a fin mask across the fin template layer and fill layer over the fin mesa, in accordance with an embodiment of the present invention.

FIG. 9 is a cross-sectional side view of the AA cross-section of FIG. 7 showing a fin mask across the fin template layer and fill layer over the fin mesa, in accordance with an embodiment of the present invention.

In various embodiments, the fin masks 150 can extend over portions of the fill layer 140 and elevated substrate tier 115, where the a portion of the fin masks 150 are above ledges 117, 118, and portions of the fin masks are over the adjoining substrate surface.

Figure 10:
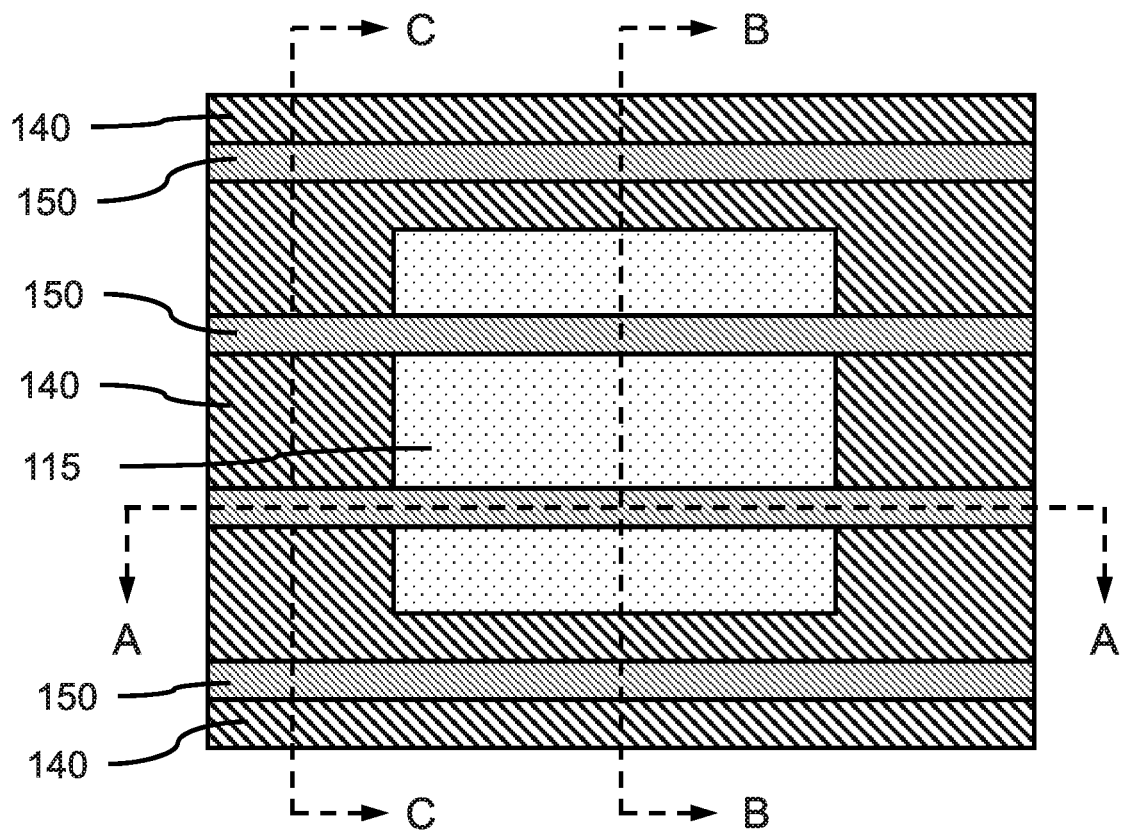
FIG. 10 is a top view showing fin masks on a plurality of vertical fins, and an exposed top surface of the fin mesa, in accordance with an embodiment of the present invention.

FIG. 10 is a top view showing fin masks on a plurality of vertical fins, and an exposed top surface of the fin mesa, in accordance with an embodiment of the present invention.

In one or more embodiments, a plurality of vertical fins can be formed by etching the pattern of the fin masks 150 into the fin template layer 130 and fin mesa 120, where a surface of the fin mesa 120 can be exposed between the fin masks 150. Dummy fin portions of the vertical fins can be formed by etching the pattern of the fin masks 150 into the fill layer on opposite ends of the fin mesa 120. A plurality of dummy fins can be formed by etching the pattern of the fin masks 150 into the fill layer 140 on opposite sides of the fin mesa 120.

Figure 11:
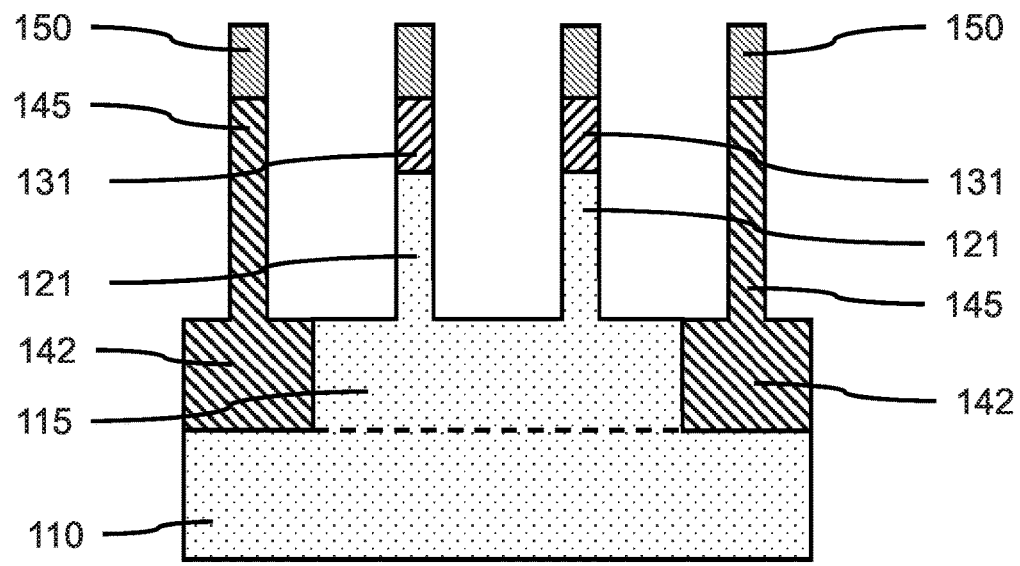
FIG. 11 is a cross-sectional side view of the BB cross-section of FIG. 10 showing the fin masks on the plurality of vertical fins, a plurality of fin masks on a pair of dummy fins, and a top surface of the elevated substrate tier exposed by removing portions of the fin mesa, in accordance with an embodiment of the present invention.

FIG. 11 is a cross-sectional side view of the BB cross-section of FIG. 10 showing the fin masks on the plurality of vertical fins, a plurality of fin masks on a pair of dummy fins, and a top surface of the elevated substrate tier exposed by removing portions of the fin mesa, in accordance with an embodiment of the present invention.

In one or more embodiments, portions of the fin template layer 130, fin mesa 120, and fill layer 140 can be removed to form one or more fin template(s) 131 from the fin template layer 130, and a vertical fin 121 from the fin mesa 120 under each of the fin template(s) 131. A dummy fin 145 can be formed from the fill layer on opposite sides of the fin mesa 120. The fin template(s) 131, vertical fin(s) 121, and dummy fins 145 can be formed by a two-step process of removing the portions of the fin template layer 130 and fill layer 140 exposed between the fin masks 150 using a first selective, directional etch (e.g., RIE), and removing the exposed portions of the fin mesa 120 using a second selective, directional etch (e.g., RIE). The fin mesa 120 can be etched down to the elevated substrate tier 115 to form the one or more vertical fin(s) 121.

In various embodiments, the vertical fin(s) 121 can have a height from the surface of the elevated substrate tier 115 in a range of about 20 nm to about 100 nm, or in the range of about 20 nm to about 70 nm, or in the range of about 20 nm to about 40 nm, although other heights are contemplated. The dummy fins 145 can be formed to a height equal to or greater than the combined height of the vertical fin 121 and fin template 131.

In various embodiments, the vertical fins 121 can have a fin pitch in a range of about 20 nm to about 50 nm, or about 30 nm to about 40 nm, although other fin pitches are contemplated. The fin pitch can determine the width of the fin mesa 120 for fabricating a predetermined number of vertical fins 121. In various embodiments, each vertical fin 121 can have a width in a range of about 5 nm to about 10 nm, or in a range of about 6 nm to about 8 nm.

In various embodiments, a remaining portion of the fill layer below the dummy fins 145 can form an isolation region 142. The height of the isolation region 142 can be different that the height of the elevated substrate tier 115, so the top surface of the isolation region 142 may not be flush with the top surface of the elevated substrate tier 115, ledges 117, 118, and/or bottom of the vertical fin(s) 121. The isolation region 142 can surround the elevated substrate tier 115.

Figure 12:
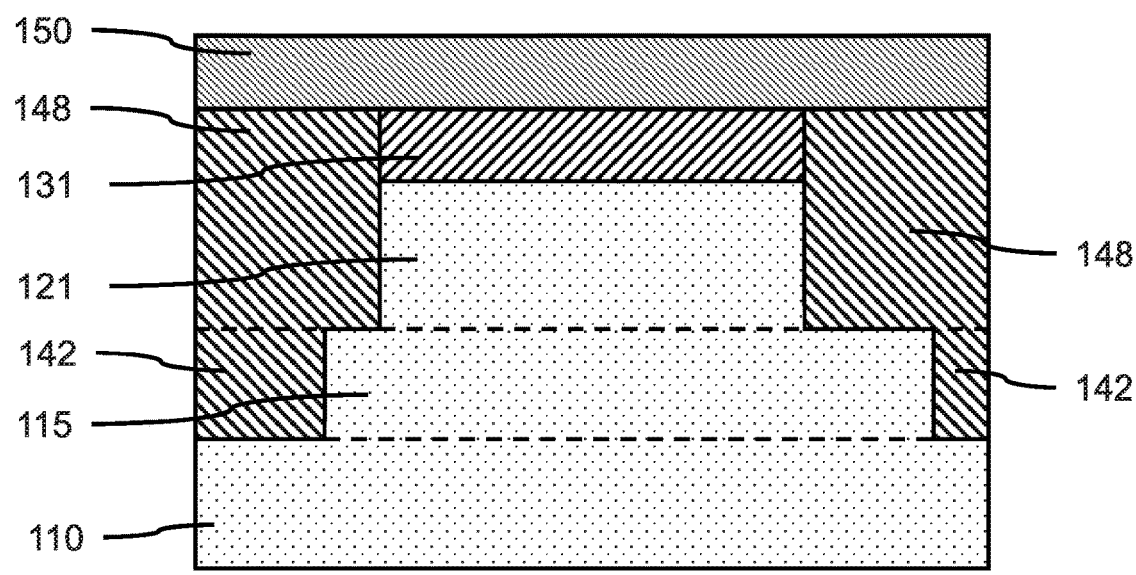
FIG. 12 is a cross-sectional side view of the AA cross-section of FIG. 10 showing a fin mask on a vertical fin and adjoining dummy fin portions, and the dummy fin portions on the elevated substrate tier, in accordance with an embodiment of the present invention.

FIG. 12 is a cross-sectional side view of the AA cross-section of FIG. 10 showing a fin mask on a vertical fin and adjoining dummy fin portions, and the dummy fin portions on the elevated substrate tier, in accordance with an embodiment of the present invention.

In one or more embodiments, dummy fin portions 148 adjoining the vertical fin(s) 121 can be formed from the fill layer 140 in contact with the endwalls of the fin mesa 120. The line of the fin masks 150 extending beyond the endwalls of the fin mesa 120 can be used to mask etching a continuous fin structure into the fill layer 140 and fin mesa 120. A dummy fin portion 148 can be on opposite ends of each vertical fin 121, where the length of each of the dummy fin portions 148 can be in a range of about 20 nm to about 100 nm, or in a range of about 40 nm to about 75 nm, where the length of each of the dummy fin portion can be sufficient to compensate for the greatest variation of a gate length caused by the tapering of the layers forming the gate structure.

Figure 13:
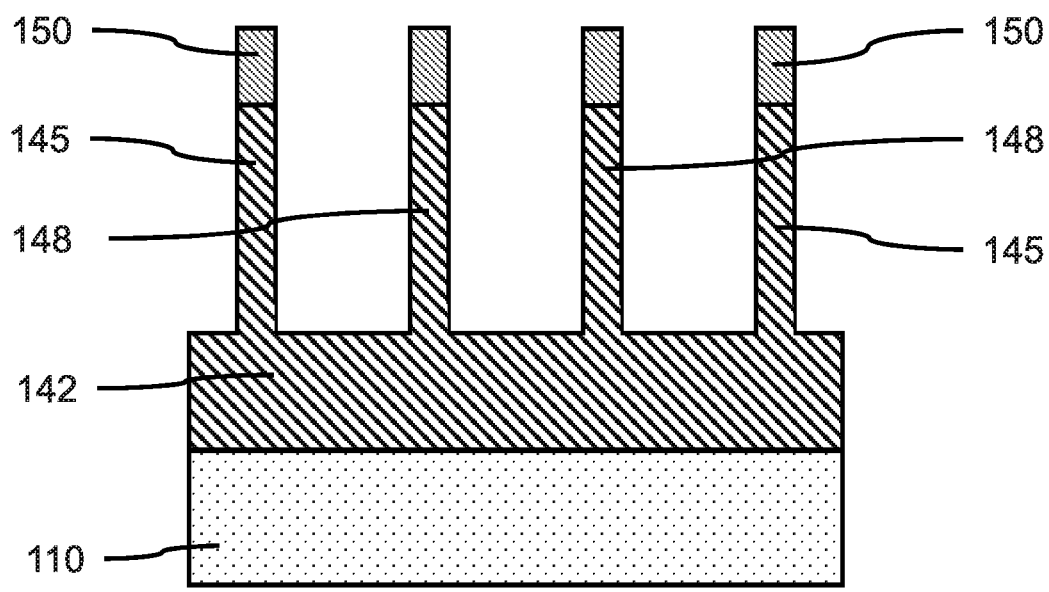
FIG. 13 is a cross-sectional side view of the CC cross-section of FIG. 10 showing fin masks on the dummy fins and dummy fin portions, in accordance with an embodiment of the present invention.

FIG. 13 is a cross-sectional side view of the CC cross-section of FIG. 10 showing fin masks on the dummy fins and dummy fin portions, in accordance with an embodiment of the present invention.

In various embodiments, a plurality of dummy fins 145 and dummy fin portions 148 can be formed on the isolation region 142, where the dummy fins 145 and dummy fin portions 148 are not part of an active device channel formed by the vertical fin(s) 121.

Figure 14:
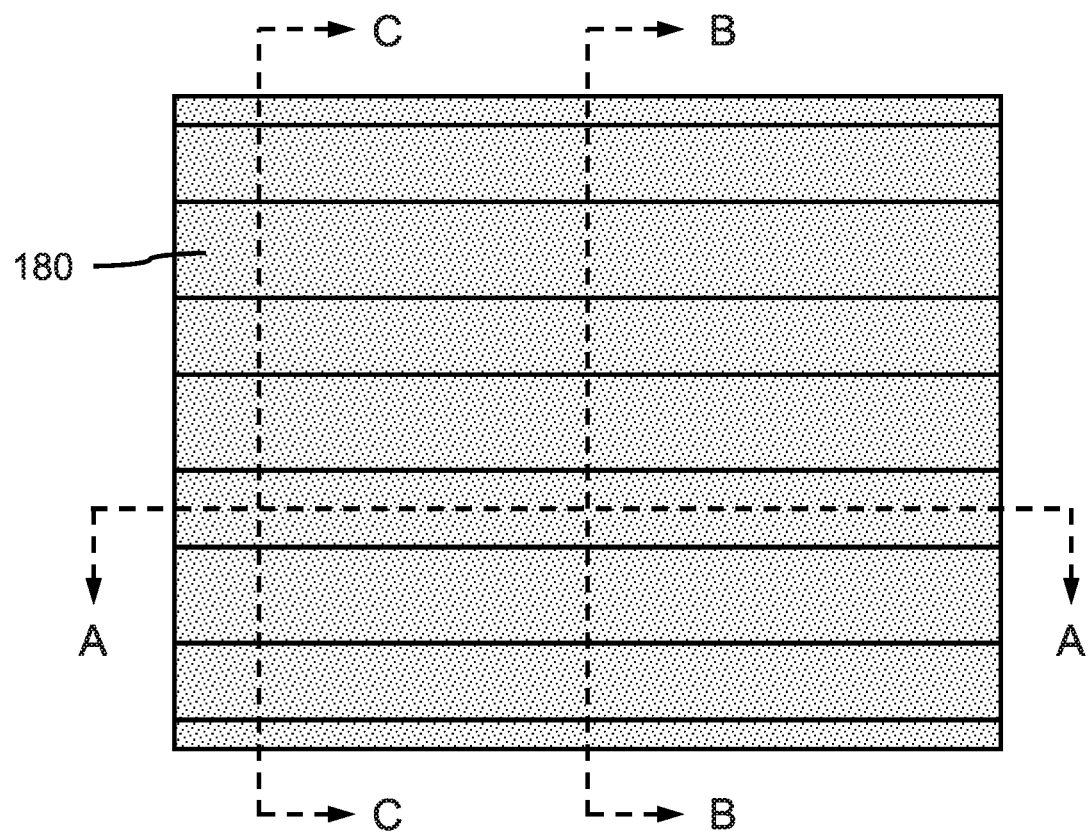
FIG. 14 is a top view showing a work function layer on a gate dielectric layer over the vertical fins and dummy fins, in accordance with an embodiment of the present invention.

FIG. 14 is a top view showing a work function layer on a gate dielectric layer over a bottom spacer layer and the vertical fins and dummy fins, in accordance with an embodiment of the present invention.

In one or more embodiments, a work function layer 180 can be formed on the vertical fins 121, dummy fin portions 148, and dummy fins 145.

Figure 15:
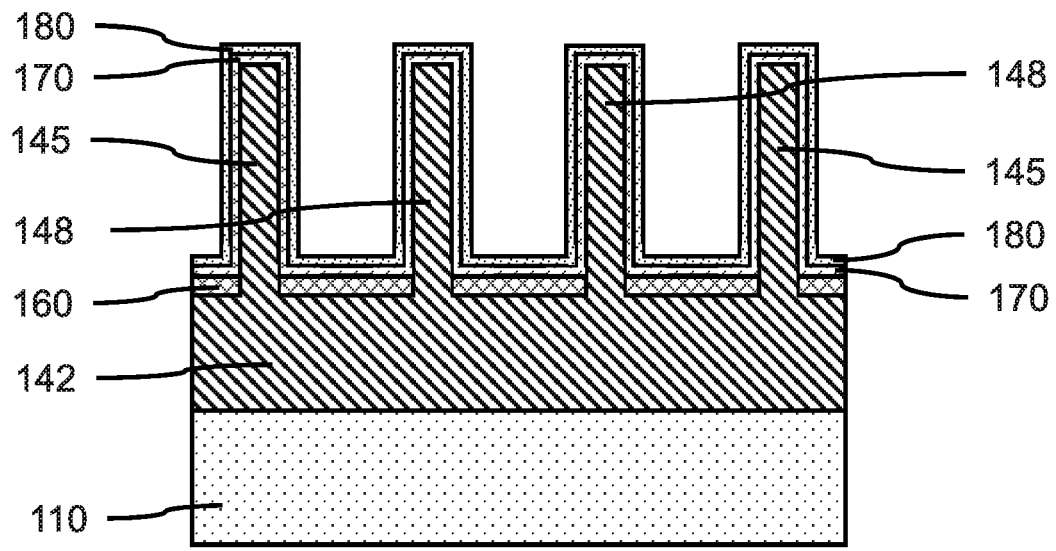
FIG. 15 is a cross-sectional side view of the CC cross-section of FIG. 14 showing the work function layer on the gate dielectric layer over the dummy fins and dummy fin portions, in accordance with an embodiment of the present invention.

FIG. 15 is a cross-sectional side view of the CC cross-section of FIG. 14 showing the work function layer on the gate dielectric layer over the dummy fins and dummy fin portions, in accordance with an embodiment of the present invention.

In one or more embodiments, a bottom spacer layer 160 can be formed on the exposed portions of the elevated substrate tier 115, ledges 117, 118, and isolation region 142, where the bottom spacer layer 160 can be formed by a directional deposition, for example, gas cluster ion beam (GCIB) or high density plasma (HDP). The bottom spacer layer can have a thickness in the range of about 1 nm to about 8 nm, or about 1 nm to about 3 nm.

In one or more embodiments, the bottom spacer layer 160 can be silicon oxide (SiO), silicon nitride (SiN), silicon oxynitride (SiON), silicon carbonitride (SiCN), silicon boronitride (SiBN), silicon borocarbide (SiBC), silicon boro carbonitride (SiBCN), boron carbide (BC), boron nitride (BN), or combinations thereof.

In one or more embodiments, the fin masks 150 and bottom spacer layer material formed on the fin masks 150 can be removed to expose the top surfaces of the underlying fin templates 131, dummy fins 145, and dummy fin portions 148.

In one or more embodiments, a gate dielectric layer 170 can be formed on the exposed portions of the vertical fin(s) 121, dummy fins 145, and dummy fin portions 148, where the gate dielectric layer 170 can be formed by a conformal deposition (e.g., atomic layer deposition (ALD), plasma enhanced ALD (PEALD), chemical vapor deposition (CVD), plasma enhanced CVD (PECVD), or a combination thereof.

In one or more embodiments, a gate dielectric layer 170 can be silicon oxide (SiO), silicon nitride (SiN), silicon oxynitride (SiON), high-k dielectric materials, or a combination of these materials. Examples of high-k dielectric materials include, but are not limited to, metal oxides such as hafnium oxide (HfO), hafnium silicon oxide (HfSiO), hafnium silicon oxynitride (HfSiON), lanthanum oxide (LaO), lanthanum aluminum oxide (LaAlO), zirconium oxide (ZrO), zirconium silicon oxide (ZrSiO), zirconium silicon oxynitride (ZrSiON), tantalum oxide (TaO), titanium oxide (TiO), and aluminum oxide (AlO). The high-k material can further include dopants such as lanthanum (La) and aluminum (Al).

In one or more embodiments, a work function layer 180 can be formed on the gate dielectric layer 170. The work function layer 180 can be formed by a conformal deposition (e.g., ALD, PEALD). The work function layer 180 can fill in the offset gaps.

In various embodiments, the work function layer 180 can be a conductive nitride, including but not limited to titanium nitride (TiN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a conductive carbide, including but not limited to titanium carbide (TiC) titanium aluminum carbide (TiAlC), tantalum carbide (TaC), hafnium carbide (HfC), and combinations thereof.

The bottom spacer layer 160 can be formed on the isolation region 142 and ledges 117, 118, of the elevated substrate tier 115, where the bottom spacer layer can cover a lower portion of the dummy fins 145 and dummy fin portions 148. The gate dielectric layer 170 can be formed on the bottom spacer layer and sidewalls of the dummy fins 145 and dummy fin portions 148 not covered by the bottom spacer layer. The work function layer 180 can be formed on the gate dielectric layer 170.

Figure 16:
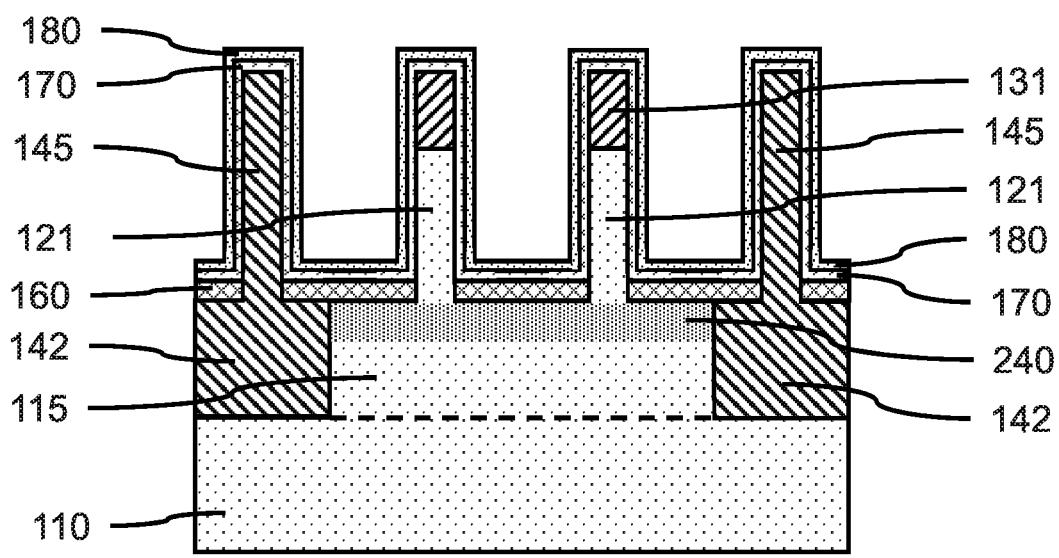
FIG. 16 is a cross-sectional side view of the BB cross-section of FIG. 14 showing the work function layer on the gate dielectric layer over the vertical fins and dummy fins, in accordance with an embodiment of the present invention.

FIG. 16 is a cross-sectional side view of the BB cross-section of FIG. 14 showing the work function layer on the gate dielectric layer over the vertical fins and dummy fins, in accordance with an embodiment of the present invention.

In various embodiments, a bottom source/drain 240 can be formed in the elevated substrate tier 115 below the one or more vertical fins 121, where the bottom source/drain can be formed by epitaxial growth or ion implantation of dopants (n-type or p-type). Epitaxial growth can include removing an additional portion of the elevated substrate tier 115, which can then be epitaxially regrown with in-situ or ex-situ doping. Doping can be accomplished using, for example, ion implantation, gas phase doping, plasma doping, plasma immersion ion implantation, cluster doping, infusion doping, liquid phase doping, solid phase doping, etc. In various embodiments, the bottom source/drain 240 can be doped to form n-type or p-type source/drains to fabricate NFETs or PFETs.

The bottom spacer layer 160 can be formed on the ledges 117, 118, of the elevated substrate tier 115, where the bottom spacer layer can cover a lower portion of the vertical fins 121. The gate dielectric layer 170 can be formed on the bottom spacer layer and sidewalls of the vertical fins 121 not covered by the bottom spacer layer. The work function layer 180 can be formed on the gate dielectric layer 170.

Figure 17:
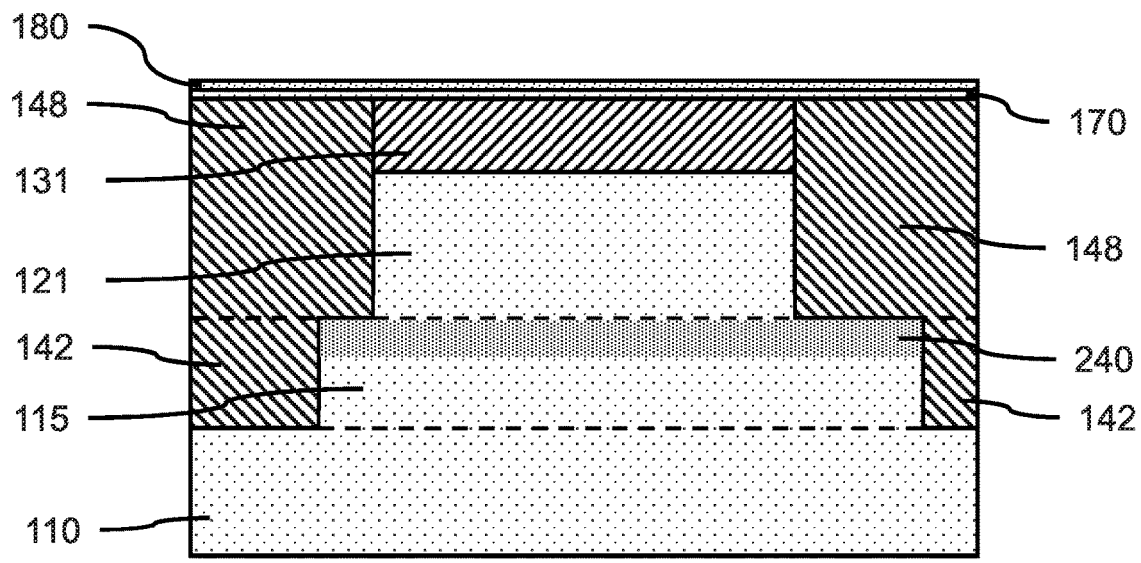
FIG. 17 is a cross-sectional side view of the AA cross-section of FIG. 14 showing the work function layer on the gate dielectric layer, and on the fin template and dummy fin portions, in accordance with an embodiment of the present invention.

FIG. 17 is a cross-sectional side view of the AA cross-section of FIG. 14 showing the work function layer on the gate dielectric layer, and on the fin template and dummy fin portions, in accordance with an embodiment of the present invention.

The work function layer 180 can be on the gate dielectric layer 170 on the fin template 131 and dummy fin portions 148.

Figure 18:
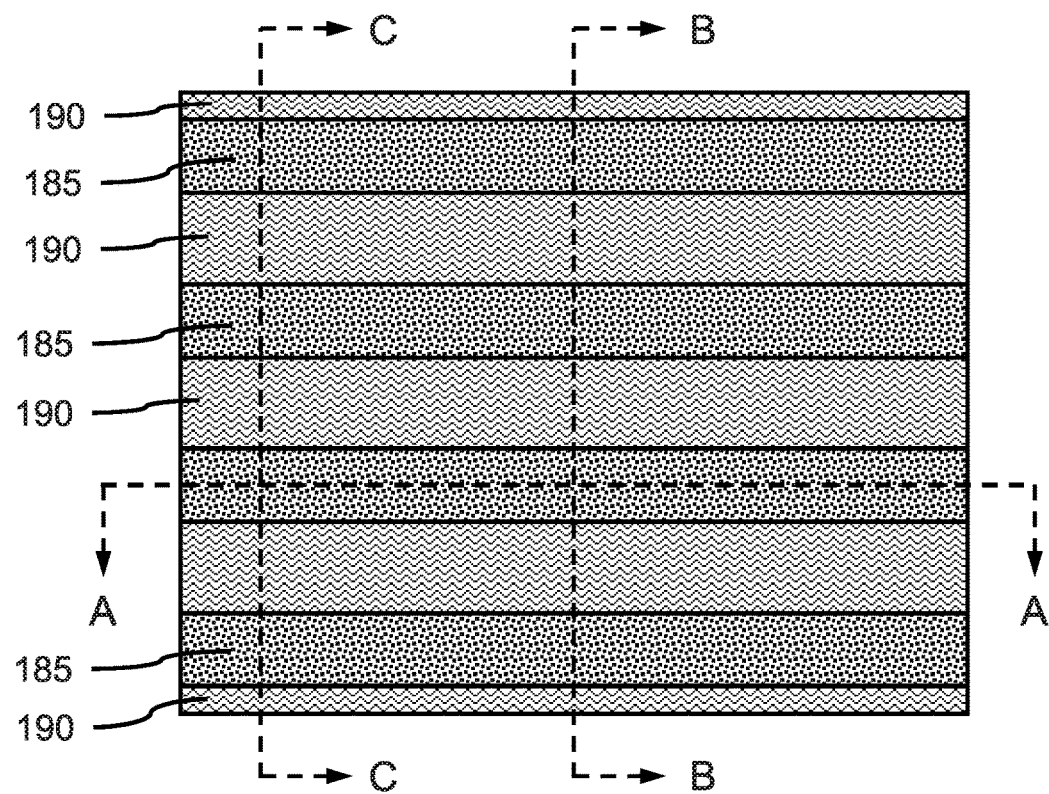
FIG. 18 is a top view showing a gauge layer on a gate metal layer between the vertical fins and dummy fins, in accordance with an embodiment of the present invention.

FIG. 18 is a top view showing a gauge layer on the gate metal layer between the vertical fins and dummy fins, in accordance with an embodiment of the present invention.

In one or more embodiments, a gate metal layer 185 can be formed on the work function layer 180 using a conformal deposition (e.g., ALD, PEALD). The gate metal layer 185 can be between the work function layer and the gauge layer 190. The gate metal layer 185 can be a conductive metal, for example, tungsten (W).

A gauge layer 190 can be formed on the gate metal layer 185 and/or work function layer 180 between the vertical fins 121 and dummy fins 145, where the gauge layer 190 can be formed by a blanket deposition and the height of the gauge layer 190 reduced to a predetermined height. The reduction in the gauge layer height can vary along the length of the vertical fins 121, dummy fin portions 148, and dummy fins 145, as well as along the fin width direction, where the variation can depend on the etch loading effect. The gauge layer 190 can see a uniform pitch between the vertical fins 121, where the presence of the dummy fins 145 and the dummy fin portions 148 can provide a uniform fin density around and along the vertical fins, so the etch loading effect can be minimized. The remaining height of the gauge layer 190 can be expected to be uniform in both length and width directions of the vertical fins 121. The height of the gauge layer 190 can determine the length of the gate structure formed on the vertical fins 121, where the gate metal layer 185 and/or work function layer 180 can have a uniform height on the vertical fins 111 using the gauge layer 190 as a mask.

The gauge layer 190 can be a soft mask material, for example, an optical planarization layer (OPL), a lithography resist material, such as a polymeric material (e.g. poly(methyl methacrylate) (PMMA), siloxanes, polydimethylsiloxane (PDMS), hydrogen silsesquioxane (HSQ), tetraethyl orthosilicate (TEOS), etc.), silicon oxide (SiO), or amorphous carbon (a-C). The reduction in height can be achieved using a dry RIE etch process.

Figure 19:
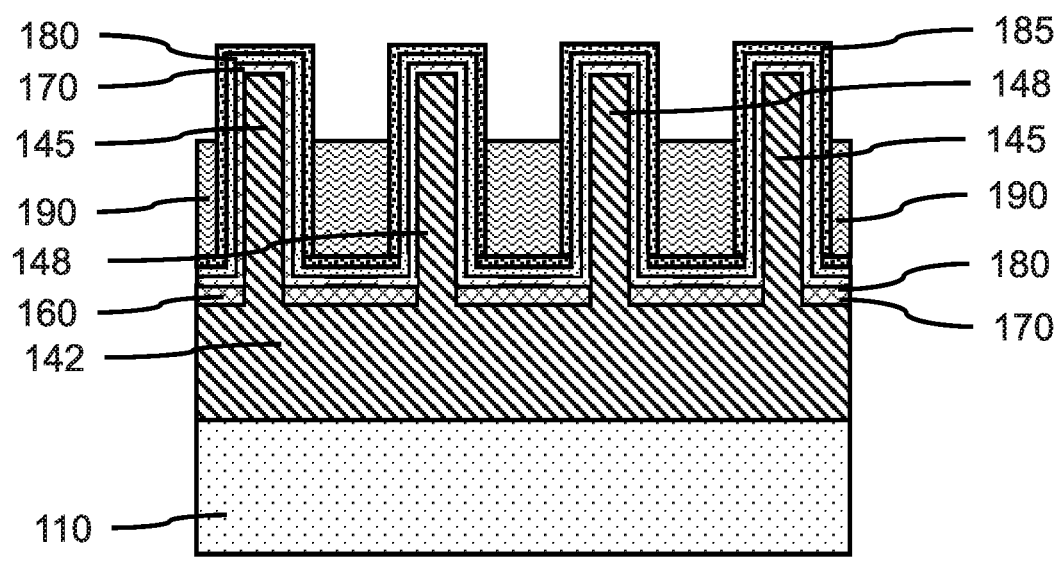
FIG. 19 is a cross-sectional side view of the CC cross-section of FIG. 18 showing the gauge layer on the gate metal layer and work function layer between the dummy fins and dummy fin portions, in accordance with an embodiment of the present invention.

FIG. 19 is a cross-sectional side view of the CC cross-section of FIG. 18 showing the gauge layer on the gate metal layer and work function layer between the dummy fins and dummy fin portions, in accordance with an embodiment of the present invention.

In one or more embodiments, an upper portion of the gate metal layer 185 can be exposed by reducing the height of the gauge layer 190.

Figure 20:
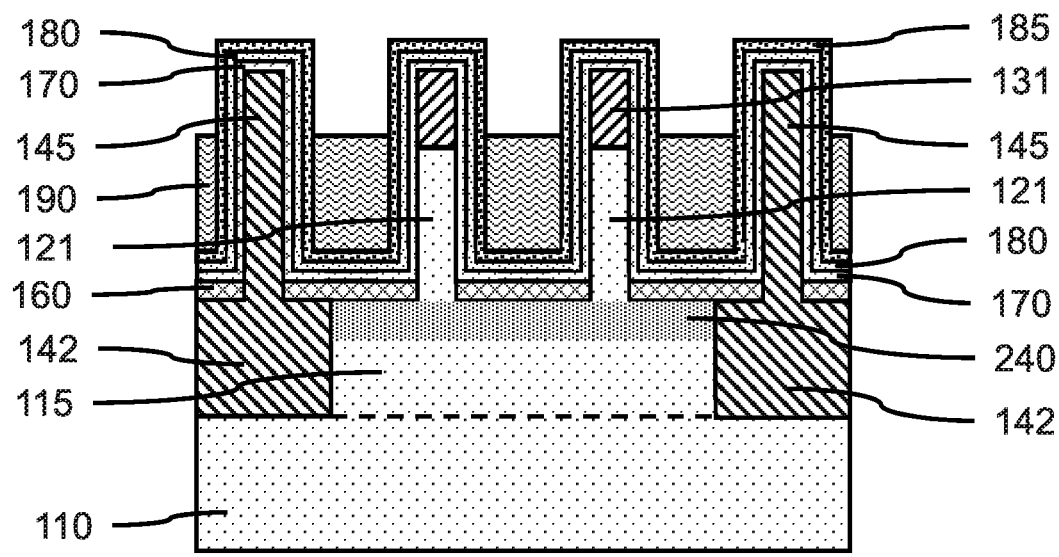
FIG. 20 is a cross-sectional side view of the BB cross-section of FIG. 18 showing the gauge layer on the gate metal layer between the vertical fins and dummy fins, in accordance with an embodiment of the present invention.

FIG. 20 is a cross-sectional side view of the BB cross-section of FIG. 18 showing the gauge layer on the work function layer between the vertical fins and dummy fins, in accordance with an embodiment of the present invention.

In one or more embodiments, the height of the gate layer can be reduced, where the top surface of the gauge layer can be at, slightly above, or slightly below the top surface of the vertical fins 121. The work function layer 180 can be exposed by reducing the height of the gauge layer 190.

Figure 21:
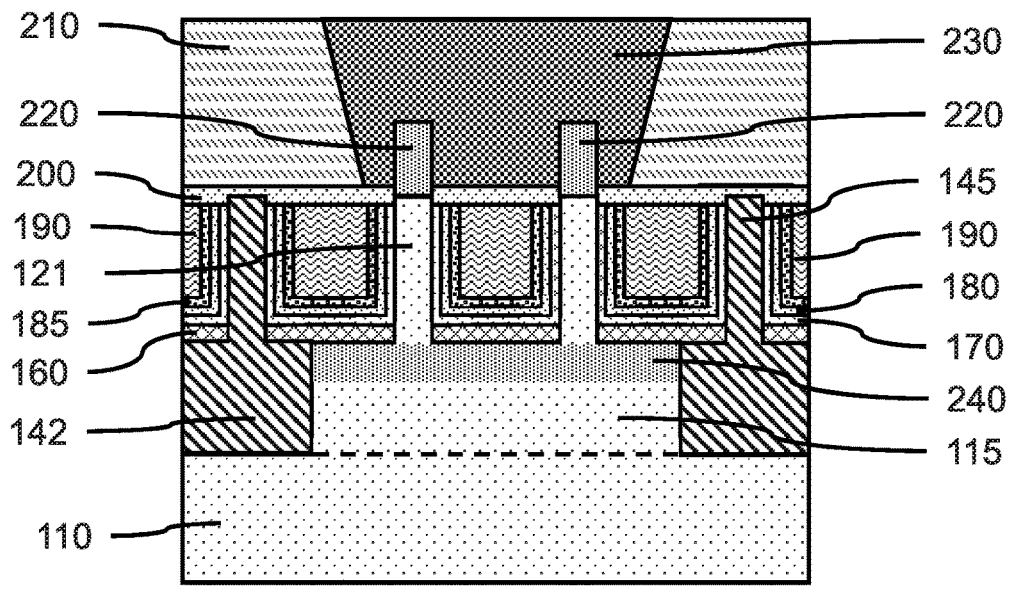
FIG. 21 is a cross-sectional side view showing a top spacer layer and interlayer dielectric layer on the gauge layer and gate structures on the vertical fins and dummy fins, in accordance with an embodiment of the present invention.

FIG. 21 is a cross-sectional side view showing a top spacer layer and interlayer dielectric layer on the gauge layer and gate structures on the vertical fins and dummy fins, in accordance with an embodiment of the present invention.

In one or more embodiments, the exposed portion of the work function layer 190 can be removed to expose the underlying portion of the gate dielectric layer 170. The exposed portion of the gate dielectric layer 170 can be removed to form a gate structure on the sidewalls of the vertical fins 121.

In one or more embodiments, a top spacer layer 200 can be formed on the gauge layer 190, work function layer 180, and gate dielectric layer 170, where the top spacer layer 200 can electrically separate the gate structure from a top source/drain.

In one or more embodiments, a top source/drain 220 can formed on each vertical fin 121. The top source/drains 220 can be formed by epitaxial growth on the exposed the top surfaces of the vertical fins 121. The top source/drains 220 can be doped to be n-type top source/drains, or p-type top source/drains, wherein the gate structure and vertical fin(s) 121 can form an NFET or a PFET. An NFET and PFET can be electrically coupled to form a complementary metal-oxide-semiconductor (CMOS) device.

In one or more embodiments, an interlayer dielectric (ILD) layer 210 can be formed on the top spacer layer 200 and the gate structure(s) on the vertical fin(s) 121.

The ILD layer 210 can be formed of a dielectric material selected from the group consisting of silicon oxide (SiO), a low-K insulating dielectric, silicon oxynitride (SiON), carbon doped silicon oxide (SiO:C), fluorine doped silicon oxide (SiO:F), boron carbon nitride (BCN), hydrogen silsesquioxane polymer (HSQ), methyl silsesquioxane polymer (MSQ), organosilicate glass (SiCOH), porous SiCOH, and combinations thereof.

In one or more embodiments, a top source/drain contact 230 can be formed through the interlayer dielectric (ILD) layer 210 to the top source/drain(s) 220. The source/drain contacts 230 can be a conductive material, including but not limited to tungsten, titanium, tantalum, ruthenium, zirconium, cobalt, tantalum nitride, titanium nitride, cobalt silicide, nickel silicide, carbon nanotube, conductive carbon, graphene, or any suitable combination of these materials.

A bottom source/drain 240 can be formed in the elevated substrate tier 115 below the one or more vertical fins 121, where dopants (n-type or p-type) can be incorporated during epitaxy or by other suitable doping techniques, including but not limited to, ion implantation, gas phase doping, plasma doping, plasma immersion ion implantation, cluster doping, infusion doping, liquid phase doping, solid phase doping, etc. In various embodiments, the bottom source/drain 240 can be doped to form n-type or p-type source/drains to fabricate NFETs or PFETs.

Figure 22:
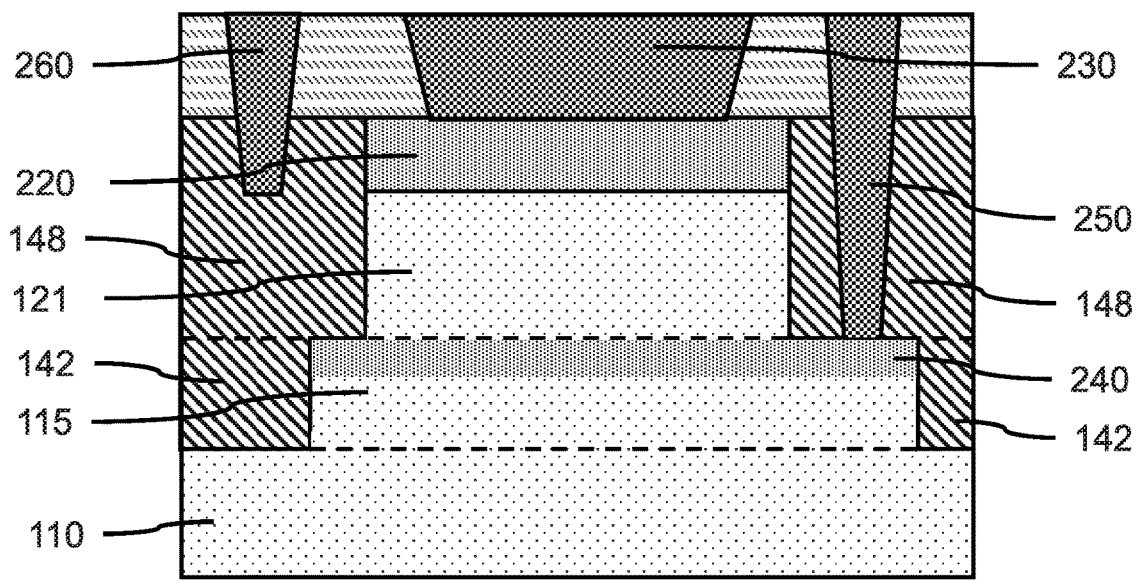
FIG. 22 is a cross-sectional side view showing a top source/drain on a vertical fin and electrical contacts formed to the top source/drain and bottom source/drain region, in accordance with an embodiment of the present invention.

FIG. 22 is a cross-sectional side view showing a top source/drain on a vertical fin and electrical contacts formed to the top source/drain and bottom source/drain region, in accordance with an embodiment of the present invention.

In one or more embodiments, a via can be formed in the ILD layer 210 to a bottom source/drain 240 formed in the elevated substrate tier 115, and a bottom source/drain contact 250 can be formed in the via to the bottom source/drain 240.

In one or more embodiments, a via can be formed in the ILD layer 210 to the gate structure, and a gate contact can be formed in the via to the work function layer 180.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative teens are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a device and method of fabricating the device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a fin field effect transistor, comprising:
    forming an elevated substrate tier on a substrate;
    forming a fin mesa on the elevated substrate tier with a fin template layer on the fin mesa, wherein the elevated substrate tier is laterally larger than the fin mesa and fin template layer;
    forming a fill layer on the substrate, wherein the fill layer surrounds the fin mesa, elevated substrate tier, and fin template layer;
    forming a plurality of fin masks on the fill layer and fin template layer; and
    removing portions of the fill layer, fin template layer, and fin mesa to form a plurality of dummy fins from the fill layer, one or more vertical fins from the fin mesa, and a dummy fin portion on opposite ends of each of the one or more vertical fins from the fill layer.

2. The method of claim 1, wherein the material of the fill layer is selected from the group consisting of silicon oxide (SiO), silicon nitride (SiN), a silicon oxynitride (SiON), a silicon carbonitride (SiCN), a silicon boronitride (SiBN), a silicon borocarbide (SiBC), a silicon boro carbonitride (SiBCN), a boron carbide (BC), a boron nitride (BN), and combinations thereof.

3. The method of claim 2, wherein the material of the fin template layer is the same material as the fill layer.

4. The method of claim 1, wherein the fin mesa has a height in a range of about 20 nm to about 100 nm.

5. The method of claim 4, wherein the elevated substrate tier has a height from the top surface of the substrate in a range of about 10 nm to about 50 nm.

6. The method of claim 4, wherein the elevated substrate tier forms a step and a ledge on each of the opposite sides of the fin mesa.

7. The method of claim 6, wherein a first of the ledges extends a distance from the face of the fin mesa in a range of about 5 nm to about 15 nm, and a second of the ledges extends a distance from the face of the fin mesa in a range of about 10 nm to about 50 nm.

8. The method of claim 7, wherein the dummy fin portion on one of the opposite ends of each of the one or more vertical fins extends over the first ledge, and the dummy fin portion on the other of the opposite ends of each of the one or more vertical fins extends over the second ledge.

9. The method of claim 8, wherein each of the dummy fin portions extends a distance of about 20 nm to about 100 nm from an endwall of the one or more vertical fins.

10. A method of forming a fin field effect transistor, comprising:
   forming an elevated substrate tier on a substrate, wherein the elevated substrate tier has a height from the top surface of the substrate in a range of about 10 nm to about 50 nm;
   forming a fin mesa on the elevated substrate tier with a fin template layer on the fin mesa, wherein the elevated substrate tier is laterally larger than the fin mesa and fin template layer;
   forming a fill layer on the substrate, wherein the fill layer surrounds the fin mesa, elevated substrate tier, and fin template layer;
   forming a plurality of fin masks on the top surface of the fill layer and fin template layer, wherein at least one of the plurality of fin masks is over a portion of the fill layer that extends from the surface of the substrate to the bottom surface of the at least one of the plurality of fin masks, and another one of the plurality of fin masks is over the fin mesa; and
   removing portions of the fill layer, fin template layer, and fin mesa to form at least one dummy fin from the fill layer, one or more vertical fins from the fin mesa, and a dummy fin portion on each of the opposite ends of each of the one or more vertical fins from the fill layer, wherein each of the dummy fin portions extends a distance of about 20 nm to about 100 nm from an endwall of the one or more vertical fins.

11. The method of claim 10, wherein a remaining portion of the fill layer forms an isolation region surrounding the elevated substrate tier.

12. The method of claim 11, wherein the at least one dummy fin is at least two dummy fins where one of the at least two dummy fins is formed on each of the opposite sides of the one or more vertical fins formed from the fin mesa, and wherein the outer sidewalls of the at least two dummy fins face away from other neighboring vertical fins.

13. The method of claim 12, further comprising forming a bottom spacer layer on the top surfaces of the isolation region and elevated substrate tier; and
   forming a gate dielectric layer on the bottom spacer layer, at least two dummy fins, one or more vertical fins, and dummy fin portions.

14. The method of claim 13, wherein the isolation region, at least two dummy fins, and dummy fin portions are made of silicon nitride (SiN).

15. The method of claim 14, wherein the one or more vertical fins have a length in a range of about 20 nm to about 200 nm.

* * * * *